(12) United States Patent
Li et al.

(10) Patent No.: US 11,361,916 B2
(45) Date of Patent: Jun. 14, 2022

(54) WATERPROOF BUTTON MODULE AND ELECTRONIC DEVICE

(71) Applicants: SHUNSIN TECHNOLOGY (ZHONG SHAN) LIMITED, Zhongshan (CN); ShunSin Technology Holdings Limited Taiwan Branch, New Taipei (TW)

(72) Inventors: Xiao Li, Zhongshan (CN); Chih-Yuan Chen, Taipei (TW); Shun-Long Lee, New Taipei (TW)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 240 days.

(21) Appl. No.: 16/850,199

(22) Filed: Apr. 16, 2020

(65) Prior Publication Data

US 2020/0335288 A1  Oct. 22, 2020

(30) Foreign Application Priority Data

Apr. 22, 2019 (CN) .......................... 201910324813.9

(51) Int. Cl.
*H01H 13/06* (2006.01)
*G06V 40/13* (2022.01)
*H05K 1/14* (2006.01)

(52) U.S. Cl.
CPC ............. *H01H 13/06* (2013.01); *G06V 40/13* (2022.01); *H05K 1/147* (2013.01); *H05K 2201/10053* (2013.01); *H05K 2201/10151* (2013.01)

(58) Field of Classification Search
CPC ........ H01H 13/06; G06V 40/13; H05K 1/147; H05K 2201/10053; H05K 2201/10151
See application file for complete search history.

(56) References Cited

U.S. PATENT DOCUMENTS

| | | | |
|---|---|---|---|
| 2008/0180120 A1* | 7/2008 | Kim | G01R 1/07342 324/754.07 |
| 2018/0218194 A1* | 8/2018 | Lee | G06V 40/13 |

(Continued)

FOREIGN PATENT DOCUMENTS

| | | |
|---|---|---|
| CN | 202502927 U | 10/2012 |
| CN | 105893958 A | 8/2016 |

(Continued)

*Primary Examiner* — Stephen G Sherman
(74) *Attorney, Agent, or Firm* — ScienBiziP, P.C.

(57) ABSTRACT

A waterproof button module includes a pressing element, a circuit board, an adhesive layer, and an elastic layer sequentially stacked. The adhesive layer is attached to the circuit board and the elastic layer. The adhesive layer includes a first opening, and the elastic layer includes a second opening. The first opening is aligned with the second opening and exposes a part of the rear surface of the circuit board. The adhesive layer has an annular zone adjacent to and surrounding the first opening. The annular zone directly contacts the circuit board. The waterproof button module further includes an electric-connection assembly and a switch. The electric-connection assembly is electrically connected to the circuit board, and passes through the first opening and the second opening. The switch is electrically connected to the circuit board, and has a button. In addition, an electronic device including the waterproof button module is disclosed.

16 Claims, 4 Drawing Sheets

(56) References Cited

U.S. PATENT DOCUMENTS

2019/0095684 A1    3/2019  Yu et al.
2019/0208043 A1*   7/2019  Cha ..................... G06F 1/1658
2022/0012451 A1*   1/2022  Sargent ............... G06F 3/03547

FOREIGN PATENT DOCUMENTS

| CN | 205609400 U | 9/2016 |
| CN | 107851177 A | 3/2018 |
| CN | 207338775 U | 5/2018 |
| TW | 201214479 A | 4/2012 |
| TW | 201214480 A | 4/2012 |
| WO | 2019/061144 A1 | 4/2019 |

* cited by examiner

WATERPROOF BUTTON MODULE AND ELECTRONIC DEVICE

FIELD

The present disclosure is relative to an electronic device and a waterproof button module thereof.

BACKGROUND

Physical buttons are widely used in electronic products, such as smart watches, smart phones, and tablet computers. Because there is a gap between the button and the shell of the electronic product, moisture and dust can easily enter the interior of the electronic product through the gap and cause damage to the components of the electronic product.

Buttons with dust and water resistance already exist but their protection against dust or moisture is not complete, a better button module is needed.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
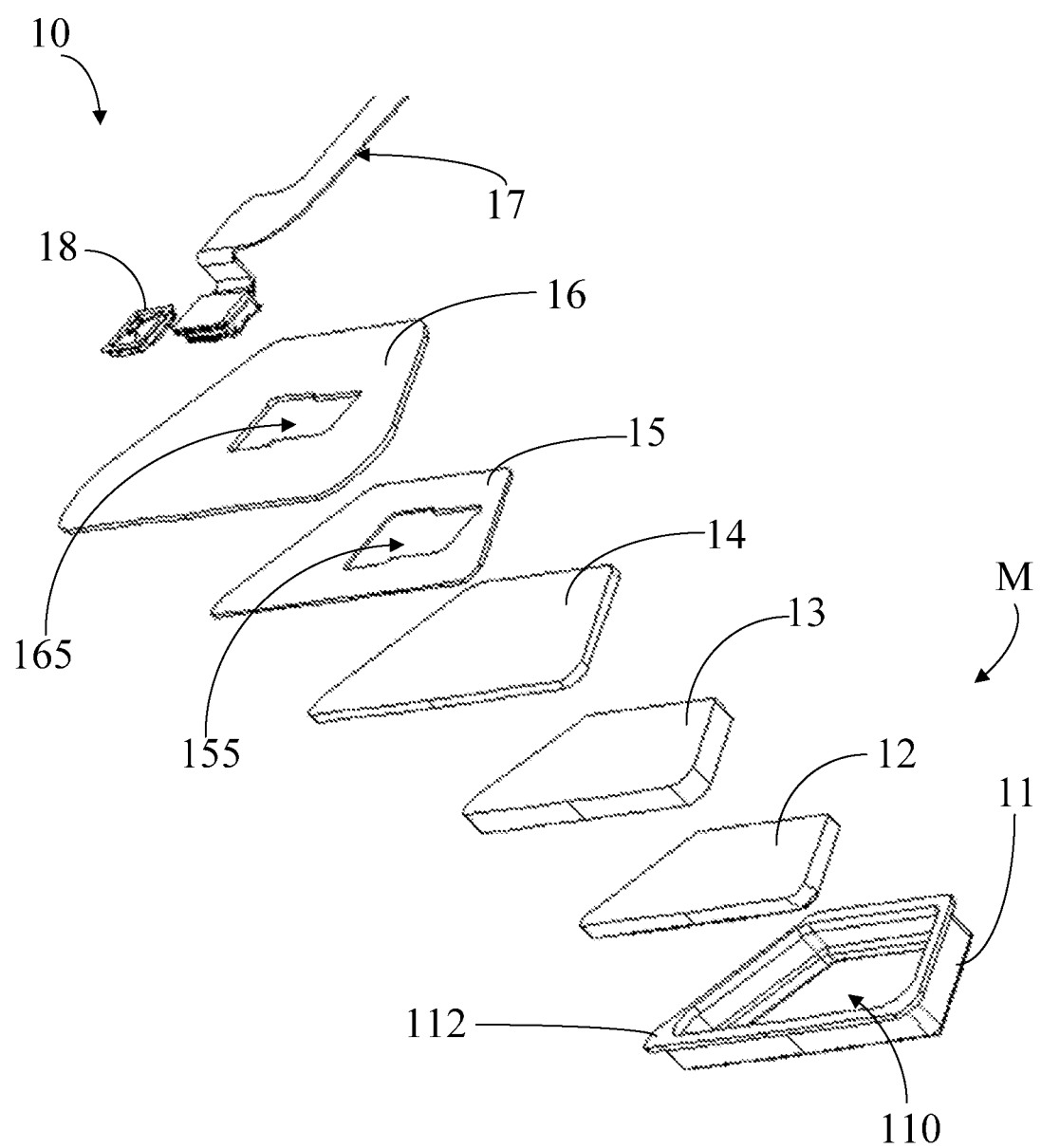
FIG. 1 is an exploded view of a waterproof button module in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The terms "coupled" and "connected" are directly or indirectly through intervening components. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
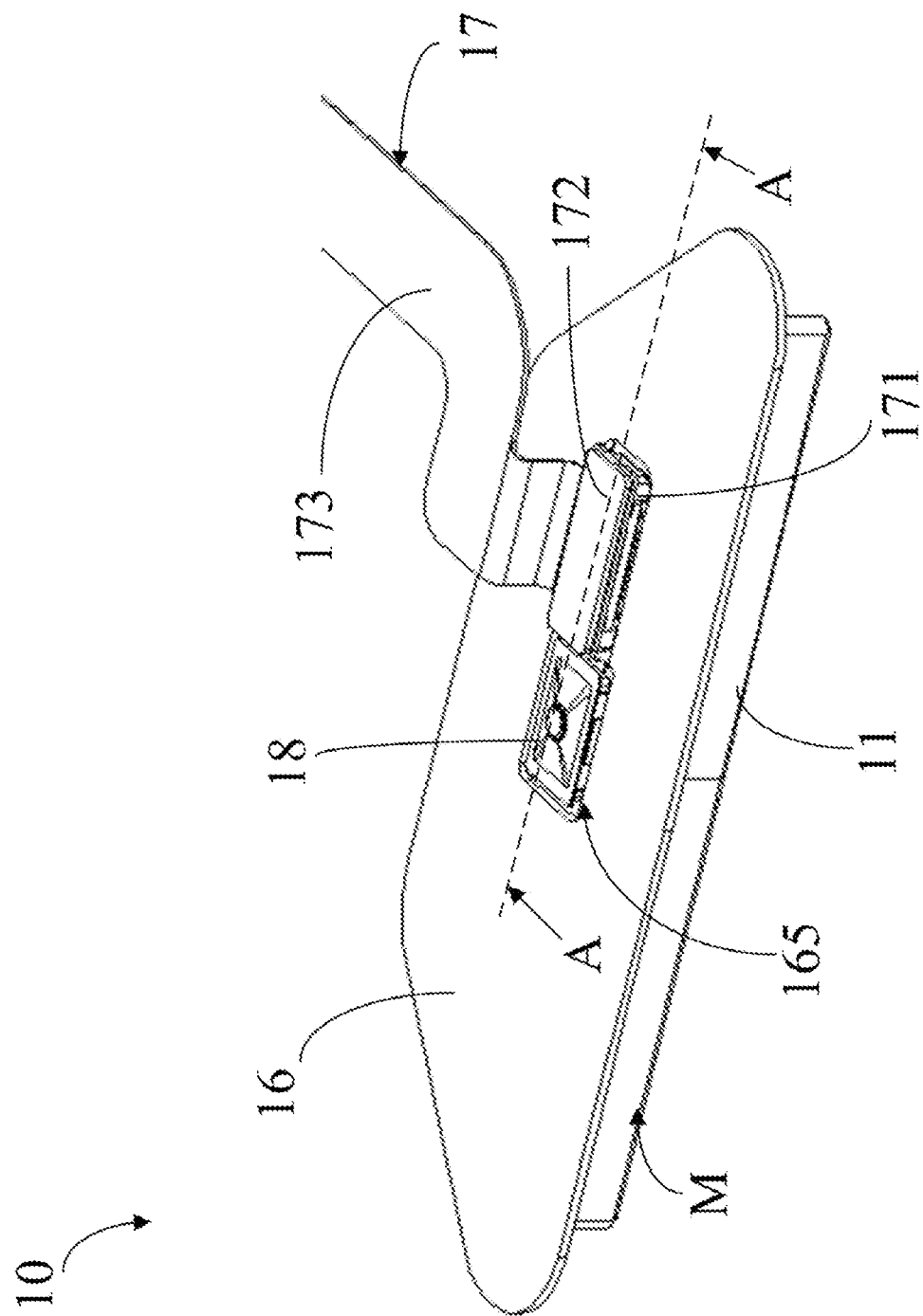
FIG. 2 is a perspective view of the waterproof button module of FIG. 1.

FIG. 1 is an exploded view of a waterproof button module 10 in accordance with one embodiment of the present disclosure. FIG. 2 is a schematic view of the waterproof button module 10 of FIG. 1. According to one embodiment of the present disclosure, the waterproof button module 10 includes a pressing element M, a circuit board 14, an adhesive layer 15, an elastic layer 16, an electric-connection assembly 17, and a switch 18. The components of the waterproof button module 10 can be varied and are not limited to this embodiment.

In the following description, the front surface of each component refers to the surface of the component near the user side, and the rear surface of each component refers to the surface of the component away from the user side.

In one embodiment, the pressing element M includes a frame 11, a fingerprint-recognition element 12, and a supporting element 13. The frame 11 may be a ring-like structure, and defines an inner space 110. The fingerprint-recognition element 12 and the supporting element 13 are disposed in the inner space 110. The circuit board 14 is affixed to the rear surface of the frame 11. Waterproof glue is infilled between the fingerprint-recognition element 12 and the frame 11, and between the circuit board 14 and the frame 11, so as to make the inner space 110 waterproof.

Figure 3:
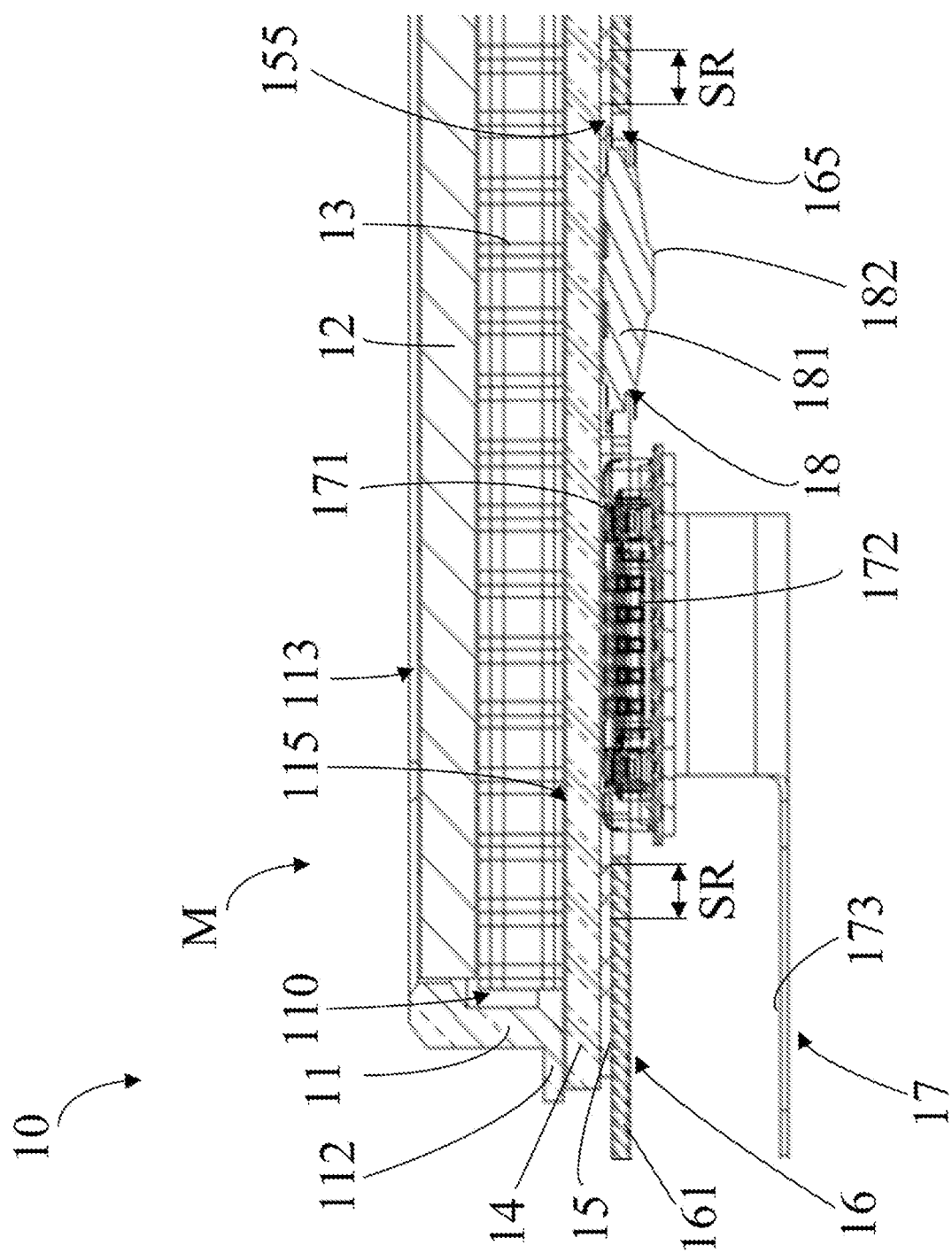
FIG. 3 is a cross-sectional view along A-A line in FIG. 2.

In particular, as shown in FIG. 3, the frame 11 has a front opening 113 and a rear opening 115. The front opening 113 is in communication with the inner space 110 near to the user, and the rear opening 115 is in communication with the inner space 110 away from the user. The supporting element 13 is disposed in the inner space 110 corresponding to the rear opening 115. The supporting element 13 may be a ceramic substrate. The fingerprint-recognition element 12 is in the inner space 110 and disposed on the supporting element 13. The shape of the fingerprint-recognition element 12 may correspond to the shape of the front opening 113, so as to seal the front opening 113. The gap between the fingerprint-recognition element 12 and the frame 11 is sealed by the waterproof glue, to prevent external moisture and dust from entering the inner space 110.

In one embodiment, the fingerprint-recognition element 12 includes a sensor for detecting fingerprints. The fingerprint-recognition element 12 can generate electronic signals of the fingerprint by optical, capacitive, RF radio frequency, thermal induction, piezoresistive, ultrasonic, piezoelectric, or other technologies. However, the fingerprint-recognition element 12 is a well-known component in this art, and the detail of the fingerprint-recognition element 12 is not described here.

The circuit board 14 is connected to the frame 11 and adjacent to the rear opening 115. The circuit board 14 is electrically connected to the fingerprint-recognition element 12 and receives the electronic signals from the fingerprint-recognition element 12. In one embodiment, the fingerprint-recognition element 12 can be electrically connected to the circuit board 14 via a flexible circuit board (not shown) in the inner space 110. In one embodiment, the supporting element 13 is omitted, the fingerprint-recognition element 12 is directly disposed on the circuit board 14.

In one embodiment, a rim 112 of the frame 11 is adjacent to the rear opening 115, and extends outwardly. The circuit board 14 is outside the inner space 110, directly contacts the rim 112, so as to cover and seal the rear opening 115 of the frame 11. The gap between the circuit board 14 and the frame 11 can be sealed by the waterproof glue.

The adhesive layer 15 is connected to the rear surface of the circuit board 14. In one embodiment, the front surface and the rear surface of the adhesive layer 15 are coated with adhesive material, so the circuit board 14 and the elastic layer 16 can be affixed to the front surface and the rear surface of the adhesive layer 15 by adhesion.

In one embodiment, the adhesive layer 15 has one or more openings for electric connections of electronic components and the circuit board 14. For example, as shown in FIG. 3, the adhesive layer 15 has a first opening 155. An area of the rear surface of the circuit board 14 can be exposed from the first opening 155 for connecting the electrical-connection assembly 17 and the switch 18. However, it should be understood that the present disclosure is not limited to this. In another embodiment, the adhesive layer 15 has two openings. One area of the rear surface of the circuit board 14 can be exposed from one of the two openings for connecting the electrical-connection assembly 17, and another area of the rear surface of the circuit board 14 can be exposed from the other one of the two openings for connecting the switch 18.

As shown in FIG. 3, the adhesive layer 15 has an annular zone SR. The annular zone SR is adjacent to and fully surrounds the first opening 155. In one embodiment, the inner edge of the annular zone SR forms the first opening 155, and the outer edge of the annular zone SR is separated from the edge of the first opening 115 by a predetermined distance. The predetermined distance is greater than 1.25 mm. In one embodiment, the annular zone SR is parallel to the circuit board 14.

In one embodiment, the predetermined distance is a fixed value (that is, the annular zone SR has a fixed width). Alternatively, the predetermined distance is variable (that is, the annular zone SR has various widths). In one embodiment, the outer edge of the annular zone SR is separated from the outer edge of the adhesive layer 15. Alternatively, the outer edge of the annular zone SR is the outer edge of the adhesive layer 15 (that is, the adhesive layer 15 is considered to be the annular zone SR).

Figure 4:
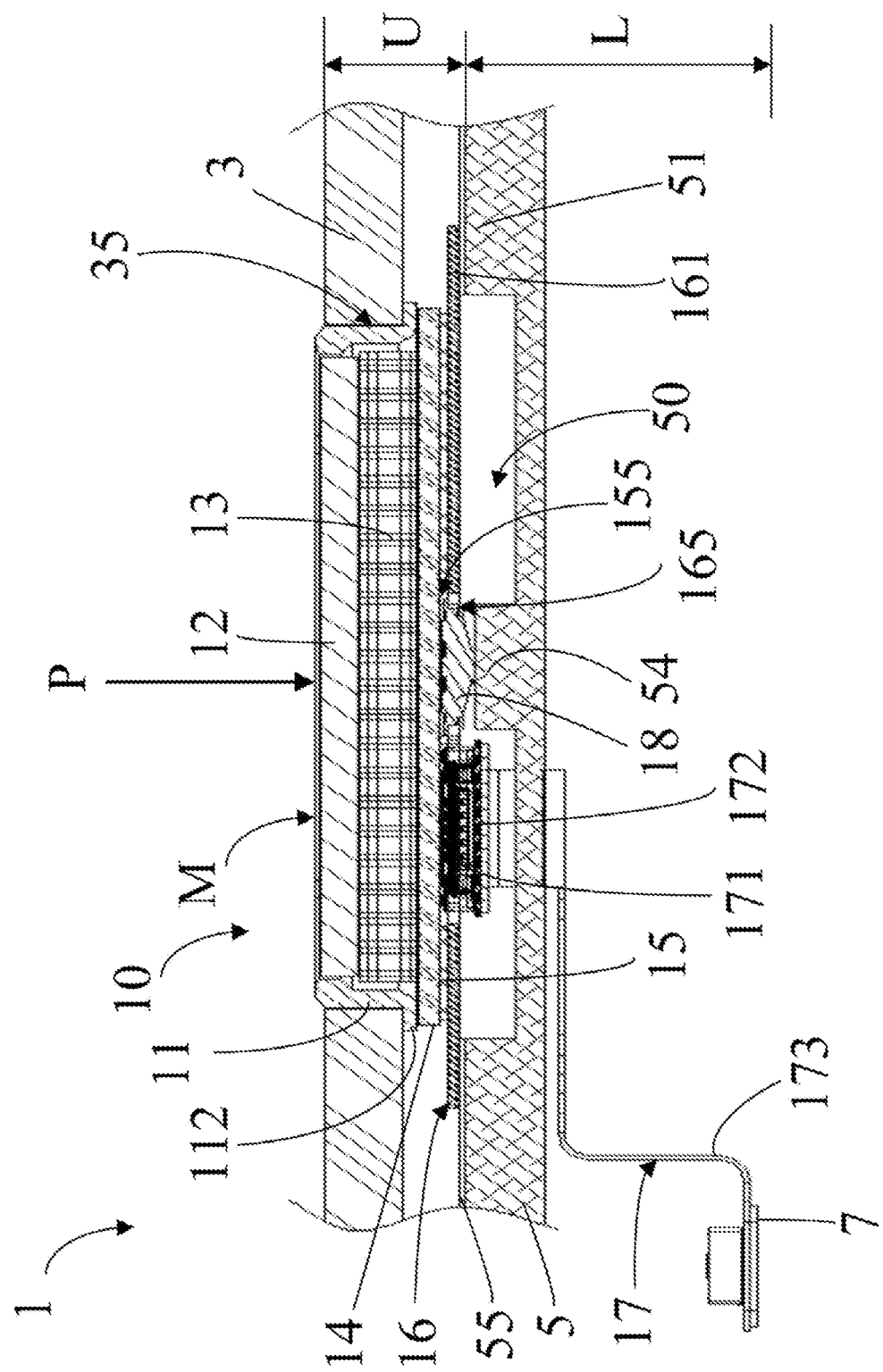
FIG. 4 is a cross-sectional view of an electronic device with the waterproof button module of FIG. 1 in accordance with one embodiment of the present disclosure.

The elastic layer 16 is attached to the rear surface of the adhesive layer 15, and is configured to connect an inner frame 5 of an electronic device 1 (as shown in FIG. 4), so that the waterproof button module 10 can move relative to the inner frame 5 of the electronic device 1. The connection relationship between the elastic layer 16 and the inner frame 5 of the electronic device 1 is explained by FIG. 4.

In one embodiment, the elastic layer 16 is made of elastic materials, such as silicone or rubber or both, and has one or more openings for the electrical connections of the electronic components and the circuit board 14. For example, as shown in FIG. 3, the elastic layer 16 has a second opening 165. An area of the rear surface of the circuit board 14 is exposed from the second opening 165 for connecting the electrical-connection assembly 17 and the switch 18. However, it should be understood that the present disclosure is not limited to this. In another embodiment, the elastic layer 16 has two openings. One area of the rear surface of the circuit board 14 is exposed from one of the two openings for connecting the electrical-connection assembly 17, and another area of the rear surface of the circuit board 14 is exposed from the other one of the two openings for connecting the switch 18.

In one embodiment, as shown in FIG. 3, the area of the second opening 165 is less than the area of the first opening 155. Therefore, the edge of the second opening 165 is under the first opening 155. With this configuration, the alignment tolerance of the adhesive layer 15 and the elastic layer 16 during an alignment process is increased.

In one embodiment, the elastic layer 16 directly contacts and adheres to the rear surface of the annular zone SR of the adhesive layer 15 (that is, no other components are provided between the two). As a result, moisture cannot enter through the gap between the elastic layer 16 and the adhesive layer 15. In one embodiment, the circuit board 14 directly contacts and adheres to the front surface of the annular zone SR of the adhesive layer 15 (that is, no other components are provided between the two). As a result, moisture cannot enter through the gap between the circuit board 14 and the adhesive layer 15.

In one embodiment, the elastic layer 16 includes a holding portion 161. The holding portion 161 may be a ring-like shape. The holding portion 161 extends outward from a projection line of the outer edge of the circuit board 14 on the elastic layer 16, and the second opening 165 is inside the area surrounded by the projection line. Therefore, the outer edge of the circuit board 14 is adjacent to a location between the holding portion 161 and the second opening 165.

The electric-connection assembly 17 is configured to transmit electronic signals and power between the circuit board 14 and external electronic components (such as the CPU of the electronic device 1). In one embodiment, the electric-connection assembly 17 includes a first connector 171, a second connector 172, and a flexible circuit board 173. The first connector 171 is inside the first opening 155 and the second opening 165 and affixed to the circuit board 14. The second connector 172 is detachably connected to the first connector 171. The flexible circuit board 173 is located outside the first opening 155 and the second opening 165 and fastened to the second connector 172.

In one embodiment, the first connector 171 is a male connector, and the second connector 172 is a female connector. Alternatively, the first connector 171 is a female connector and the second connector 172 is a male connector. The configuration of connecting the first connector 171 and the second connector 172 in a detachable manner can simplify the assembly process and increase the assembly efficiency. After the first connector 171 and the second connector 172 are assembled, parts of the electric-connection assembly 17 (for example, the first connector 171, or the first connector 171 and the second connector 172) pass through the first opening 155 and the second opening 165.

The switch 18 is configured to emit an electronic signal when the waterproof button module 10 is pressed. In one embodiment, the switch 18 is inside the first opening 155 and the second opening 165, and fastened on the circuit board 14. In another embodiment, the switch 18 is located outside the first opening 155 and the second opening 165, and set on the rear surface of the elastic layer 16. The switch 18 is electrically connected to the circuit board 14 in a suitable manner (for example, through a flexible circuit board).

In one embodiment, the switch 18 includes a body 181 and a button 182. The body 181 is in the first opening 155 and the second opening 165, and electrically connected to the circuit board 14. The button 182 is disposed on the body 181, and passes through the first opening 155 and the second opening 165 in a direction that is away from the circuit board 14. The top of the button 182 protrudes over the elastic layer 16 in a pressing direction of the pressing element M. Therefore, the planes on which the button 182 and the elastic layer 16 are separated from each other by a predetermined distance in the pressing direction of the pressing element M.

The pressing direction is, for example, the direction of a force P in FIG. 4. The predetermined distance is greater than a minimum travel of the button 182 required for the switch 18 emitting the electronic signal when the button 182 is pressed.

In one embodiment, the electric-connection assembly 17 is separated from the switch 18 by a distance, and the signal sent by the switch 18 is transmitted to the electric-connection assembly 17 via the circuit board 14. Moreover, the fingerprint-recognition element 12 and the electric-connection assembly 17 are respectively located on opposite sides of the circuit board 14. The signal sent by the fingerprint-recognition element 12 is transmitted to the electric-connection assembly 17 via the circuit board 14.

FIG. 4 is a cross-sectional view of the electronic device 1. In one embodiment, the electronic device 1 includes a housing 3, the inner frame 5, and the waterproof button module 10. The housing 3 includes a through hole 35. The inner frame 5 is disposed in the housing 3 for carrying the waterproof button module 10. In one embodiment, the inner frame 5 includes a retaining portion 51 and an abutting portion 54. The retaining portion 51 is a ring-like shape, and has a recess 50. The abutting portion 54 is disposed on the center of the recess 50. The pressing element M of the waterproof button module 10 passes through the through hole 35. The button 182 of the switch 18 abuts against the abutting portion 54, and the holding portions 161 of the elastic layer 16 are fixed on the retaining portion 51 by a waterproof glue 55. In this way, when the pressing element M is pressed by an external force P, the movement of the pressing element M toward the inner frame 5 deforms the elastic layer 16 and presses the button 182 onto the abutting portion 54, to drive the switch 18 to send a start signal. Moreover, after the external force P is removed, the elastic layer 16 provides elastic restoring force to return the pressing element M to its original position, so that the pressing element M can move back and forth relative to the inner frame 5.

As shown in FIG. 4, the annular zone SR of the adhesive layer 15 adheres to the circuit board 14 and the elastic layer 16, and is flat. On the other hand, the surface of the elastic layer 16 in contact with the inner frame 5 is coated with the waterproof glue 55. Therefore, moisture or dust is excluded from an upper area U over the inner frame 5 into a lower area L of the inner frame 5, which can protect the electronic components, such as an information processor 7 connected to the electric-connection assembly 17, below the inner frame 5. Compared with conventional waterproof button modules on the market, a bent flexible circuit board is provided between an adhesive layer and a circuit board, which avoids the adhesive layer directly contacting the circuit board. As a result, the waterproof button module of the present disclosure has better waterproofing.

Many details are often found in the art such as the other features of waterproof button modules. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A waterproof button module comprising:
a pressing element, a circuit board, an adhesive layer, and an elastic layer stacking in said sequence, wherein the adhesive layer is attached to the circuit board and the elastic layer;
wherein the pressing element comprises a fingerprint-recognition element and a frame, the fingerprint-recognition element is disposed in the frame and electrically connected to the circuit board, and the circuit board and the adhesive layer are outside of the frame;
wherein the adhesive layer comprises a first opening and the elastic layer comprises a second opening, the first opening is aligned with the second opening and exposes a part of a rear surface of the circuit board, and the adhesive layer has an annular zone adjacent to and surrounding the first opening, and directly contacting the circuit board;
wherein the waterproof button module further comprises an electric-connection assembly and a switch, the electric-connection assembly is electrically connected to the circuit board, and passes through the first opening and the second opening, and the switch is electrically connected to the circuit board,
wherein the electric-connection assembly comprises a first connector separated from the switch, the first connector and the switch are inside the first opening and the second opening, and are affixed to the circuit board.

2. The waterproof button module as claimed in claim 1, wherein the electric-connection assembly further comprises a second connector, and a flexible circuit board, the first connector is affixed to the circuit board, the second connector is detachably connected to the first connector, and the flexible circuit board is affixed to the second connector.

3. The waterproof button module as claimed in claim 1, wherein the frame is a ring-like shape, and the fingerprint-recognition element seals a front opening of the frame, and the circuit board seals a rear opening of the frame.

4. The waterproof button module as claimed in claim 1, wherein the fingerprint-recognition element and the electric-connection assembly are respectively disposed on two opposite sides of the circuit board, and a signal sent by the fingerprint-recognition element is transmitted to the electric-connection assembly via the circuit board.

5. The waterproof button module as claimed in claim 1, wherein the switch passes through the first opening and the second opening.

6. The waterproof button module as claimed in claim 1, wherein an inner edge of the annular zone forms the first opening, and a distance between an outer edge of the annular zone and the inner edge of the annular zone is greater than 1.25 mm.

7. The waterproof button module as claimed in claim 1, wherein the fingerprint-recognition element and the electric-connection assembly are respectively located on opposite sides of the circuit board.

8. The waterproof button module as claimed in claim 1, wherein the elastic layer comprises a holding portion, and an outer edge of the circuit board is adjacent to a location between the holding portion and the second opening.

9. The waterproof button module as claimed in claim 1, wherein an area of the second opening is less than an area of the first opening.

10. The waterproof button module as claimed in claim 1, wherein the switch comprises a body in the first opening and the second opening, and a button disposed on the body, wherein a top of the button protrudes over the adhesive layer.

11. An electronic device comprising:
a housing comprising a through hole;
an inner frame disposed in the housing and comprising an abutting portion and a retaining portion, wherein the abutting portion corresponds to the through hole, and the retaining portion is farther from the through hole than the abutting portion; and
a waterproof button module comprising a pressing element, a circuit board, an adhesive layer, and an elastic layer stacking in said sequence, wherein the adhesive layer is attached to the circuit board and the elastic layer;
wherein the pressing element comprises a fingerprint-recognition element and a frame, the fingerprint-recognition element is disposed in the frame and electrically connected to the circuit board, and the circuit board and the adhesive layer are outside of the frame;
wherein the adhesive layer comprises a first opening and the elastic layer comprises a second opening, the first opening is aligned with the second opening and exposes a part of a rear surface of the circuit board, and the adhesive layer has an annular zone adjacent to and surrounding the first opening, and directly contacting the circuit board;
wherein the waterproof button module further comprises an electric-connection assembly and a switch, the electric-connection assembly is electrically connected to the circuit board, and passes through the first opening and the second opening, and the switch is electrically connected to the circuit board,
wherein the pressing element passes through the through hole, the switch abuts against the abutting portion, and an outer edge of the elastic layer of the waterproof button module is fixed on the retaining portion by waterproof glue, so that the pressing element is moveable relative to the inner frame via the elastic layer,
wherein the electric-connection assembly comprises a first connector separated from the switch, the first connector and the switch are inside the first opening and the second opening, and are affixed to the circuit board.

12. The electronic device as claimed in claim 11, wherein the electric-connection assembly further comprises a second connector, and a flexible circuit board, the first connector is affixed to the circuit board, the second connector is detachably connected to the first connector, and the flexible circuit board is affixed to the second connector.

13. The waterproof button module as claimed in claim 11, wherein the frame is a ring-like shape, and the fingerprint-recognition element seals a front opening of the frame, and the circuit board seals a rear opening of the frame.

14. The electronic device as claimed in claim 11, wherein the fingerprint-recognition element and the electric-connection assembly are respectively disposed on two opposite sides of the circuit board, and a signal sent by the fingerprint-recognition element is transmitted to the electric-connection assembly via the circuit board.

15. The electronic device as claimed in claim 11, wherein the switch comprises a body in the first opening and the second opening, and a button disposed on the body, wherein a top of the button protrudes over the adhesive layer.

16. The electronic device as claimed in claim 11, wherein the inner frame further comprises a recess between the abutting portion and the retaining portion, and the electric-connection assembly is inside the recess.

\* \* \* \* \*